Figure 1:
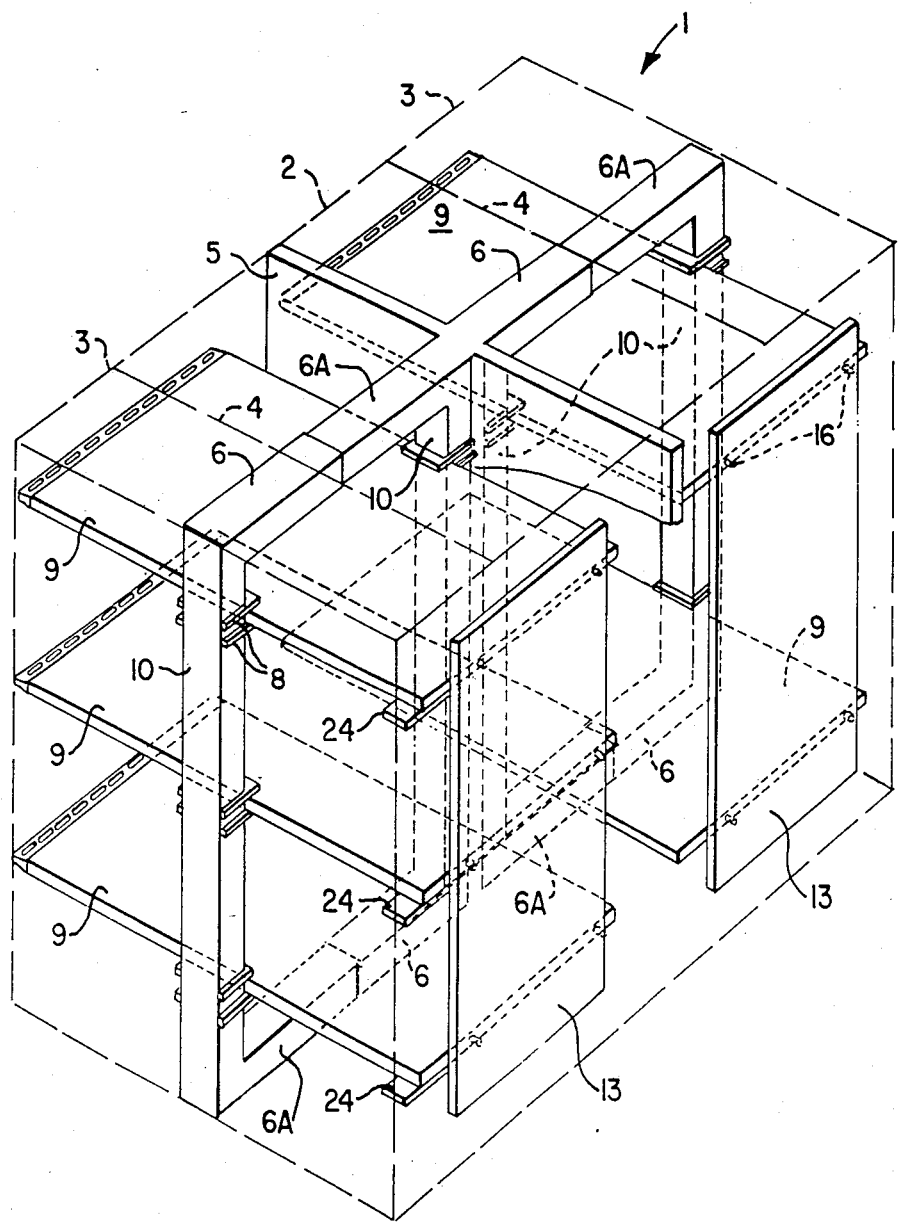

United States Patent [19]

Cogan

[11] Patent Number: 4,707,764
[45] Date of Patent: Nov. 17, 1987

[54] EQUIPMENT CABINET

[75] Inventor: Frederick T. Cogan, London, Canada

[73] Assignee: Mitel Corporation, Canada

[21] Appl. No.: 928,626

[22] Filed: Nov. 4, 1986

Related U.S. Application Data

[63] Continuation of Ser. No. 688,345, Jan. 2, 1985, abandoned.

[30] Foreign Application Priority Data

Jan. 23, 1984 [CA] Canada ................................... 445817

[51] Int. Cl.$^4$ .......................... H05K 1/14; H05K 5/00
[52] U.S. Cl. .................................... 361/390; 361/391; 361/412; 361/415
[58] Field of Search ............... 361/391, 394, 412, 413, 361/415, 390, 393, 399

[56] References Cited

U.S. PATENT DOCUMENTS

| | | | |
|---|---|---|---|
| 2,871,457 | 1/1959 | Jenks | 361/391 X |
| 2,976,510 | 3/1961 | Blain | 361/415 X |
| 3,643,204 | 2/1972 | Drenten | 361/413 X |
| 3,733,523 | 5/1973 | Reynolds et al. | 361/415 |
| 4,131,934 | 12/1978 | Becker et al. | 361/415 X |
| 4,179,724 | 12/1979 | Bonhomme | 361/415 X |
| 4,247,882 | 1/1982 | Prager et al. | 361/391 X |
| 4,287,764 | 9/1981 | Staab et al. | 361/391 X |
| 4,491,981 | 1/1985 | Weller et al. | 361/391 X |
| 4,527,222 | 7/1985 | Swingley | 361/415 |

Primary Examiner—R. R. Kucia
Attorney, Agent, or Firm—Laff, Whitesel, Conte & Saret

[57] ABSTRACT

An expandable moulded cabinet for housing printed circuit boards, which is modular and uses only two kinds of parts. Instead of printed circuit board retainers and a backplane being fastened to a cabinet frame, which would require careful attention to tolerances, the retainers are held by the cabinet in approximately correct positions, and the backplane is supported by and is fixed directly to the retainers alone, and not the cabinet. Thus the only precision tolerances required are to the locations on the backplane where the printed circuit board retainers are supported. An inexpensive and versatile cabinet results.

7 Claims, 4 Drawing Figures

EQUIPMENT CABINET

This applicaton is a continuaton of application Ser. No. 688,345, filed Jan. 2, 1985, now abandoned.

This invention relates to cabinets, and particularly to an electronic equipment cabinet such as a PABX (Private Automatic Branch Exchange) cabinet which carries, a plurality of printed circuits boards.

Electronic equipment cabinets for housing computer main frames, electronic PABXs, etc, typically have several common features. A plurality of wired or printed circuit boards are usually vertically disposed in parallel, and are plugged into a backplane or motherboard. A backplane is usually formed of a printed circuit board which is placed behind and orthogonal to the parallel printed circuit boards, and provides interconnection between them. The backplane is often itself a printed circuit board, but sometimes carries wire wrap posts for automated wiring between points. Usually the backplane carries a plurality of connectors into which the printed circuit boards are removably connected.

The cabinet therefore is usually formed of pairs of printed circuit board frames or retainers which hold the printed circuit boards in parallel relationship, and allow the printed circuit boards to be slid within guides to the backplane connectors.

The structure of the cabinet often is in a form of a rack, with a cosmetic housing. The rack is usually formed of strong and rigid materials, since it forms at least the base or the frame of the cabinet. The frames for the printed circuit boards and the backplane are screwed to the rack. The tolerance of the rack structure is important, as are the positions of the screw-holes for fastening the printed circuit board frames and the backplane. This importance is emphasized not only in order to have the cabinet fit together, but most importantly because the printed circuit hoards must slide toward and fit precisely into the connectors of the backplane.

Consequently during manufacture, due to additive tolerances or the like, adjustments must be made to avoid bending stress on the printed circuit boards once they are in place and connected to the connectors, which could result in cracking of the printed wiring, and thus ultimate-failure of the apparatus.

In addition, such cabinets are often subjected to stress during transportation to the ultimate installation site due to dropping, bouncing, etc, which can distort the cabinet an amount virtually invisible to the eye, but still to a significant extent, sufficient such that the printed circuit board alignment with the connectors would be adversely affected. Indeed, this could cause damage to the printed circuit boards if they are shipped from the factory in operating position in the cabinet. Yet it is highly desirable to ship a completely operative piece of equipment from the factory without the requirement for insertion of the printed circuit boards and retesting at the ultimate site, to save significant cost.

The present invention is an equipment cabinet which virtually eliminates the tolerance problem encountered with the aforenoted type of cabinet. Indeed, the critical alignments are competely divorced from the cabinet structure itself. Yet a rack structure is not utilized. Consequently tolerance problems in manufacturing the cabinet can be to a substantial extent disregarded with respect to the printed circuit board-backplane alignment problem. Therefore adjustments in positioning of large number of elements in the cabinet in a final adjustment procedure can be eliminated. Furthermore, the entire apparatus can be assembled at the factory and shipped with all printed circuit boards in place with a high degree of confidence in the reliability of operation when the apparatus is set up at the final site, since transportation bending stresses on the cabinet are to a substantial extent not transmitted to the backplane, printed circuit board retainer, and printed circuit boards.

In addition, a modular cabinet has been invented having a central section or sections which can interconnect with end sections and attach thereto in a simple manner. The end sections are identical, and means is provided whereby additional inner or central sections can be cascaded, all of the center sections being identical. The result is a cabinet which is formed of modular sections which can be expanded to any desired size, using only two kinds of parts, an inner section and an end section.

The cabinet sections are preferably formed of plastic, such as a rigid foamed type of plastic such as STYRON or any other suitable plastic. The sections can be held together by glue.

Each of the inner sections and the outer sections contain spaced guides for defining the approximate positions of, and retaining the printed circuit board retainers. A backplane is attached directly, and only, to the printed circuit board retainers through a precision locating structure. As a result, the printed circuit board retainers are spaced precisely relative to each other and to the backplane, whereby the printed circuit boards can be held in precise location relative to the backplane. However since the backplane is not attached to the cabinet itself, bending stresses on the cabinet do not effect the backplane. Furthermore, since the printed circuit board retainers are held with only low tolerance requirements to approximate positions, bending stresses on the cabinet substantially do not affect them. Consequently the cabinet molds need not be made to the precision otherwise required to exactly locate the relative positions of the printed circuit boards and backplane.

It should be noted that the application of the present invention as described in the detailed description below is directed to the printed circuit board-backplane location problem noted above. However the principles of the structure described could be applied to other applications as such needs arise.

In general, the preferred embodiment of the invention is an equipment cabinet for retaining circuit boards, comprising pairs of spaced guides fixed on opposite inside surfaces of the cabinet, a first circuit board retainer retained between the guides, and a circuit backplane fixed directly to an end of the retainer.

More particularly, an embodiment of the invention is an equipment cabinet for printed circuit boards comprising apparatus for retaining a plurality of circuit board guides in approximate parallel spaced positions relative to each other, apparatus precisely positioning one of the ends of each of the retaining apparatus relative to the others and fixing the ends to a backplane, whereby the backplane is held in the cabinet only by being fixed to the guides.

A further embodiment of the invention is an equipment cabinet comprising at least one inner cabinet section, including a wall separating two open side portions, a pair of end cabinet sections, the end sections being identical in form, apparatus for connecting the end sections to the inner section, to close the open side portions and thereby form a shell divided by the wall, and pairs of spaced guides fixed on each wall of the inner section and opposite inner walls of the end sections, the guides being in alignment with each other, whereby a plurality of equipment bases such as printed circuit board retainers can be held in approximate predefined positions thereby in each divided portion of the shell.

The equipment bases can form circuit board retaining apparatus, to which a backplane can be fixed spacing them relative to each other and to the backplane with precision. The backplane is only fixed to the circuit board retainers.

Figure 2:
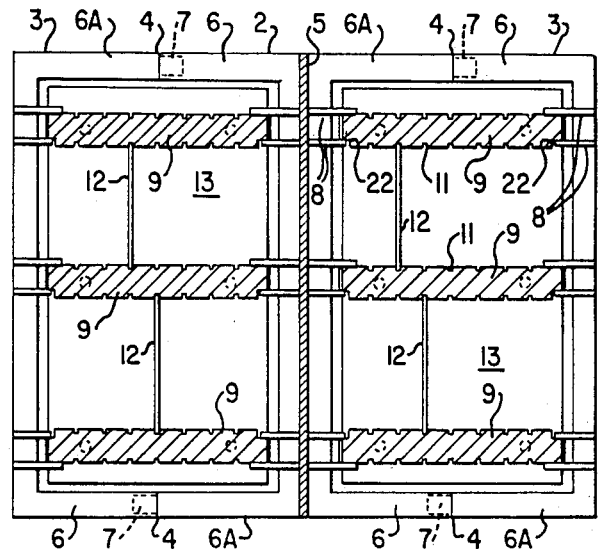
Figure 3:
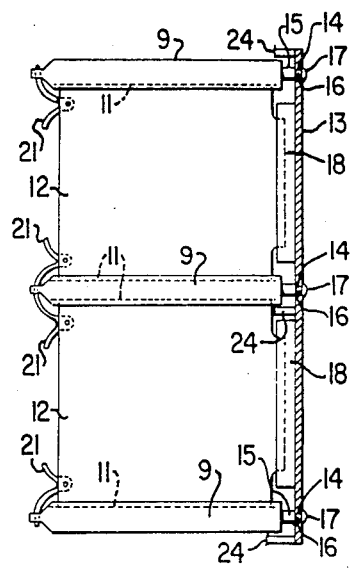
Figure 4:
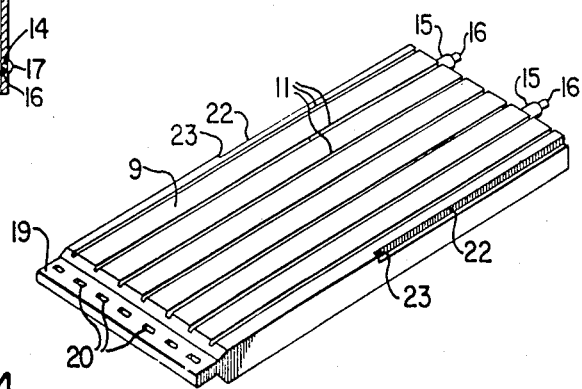

A better understanding of the invention will be obtained by reference to the detailed description below, with reference to the following drawings, in which:

FIG. 1 is a perspective view of the cabinet, from an upper rear portion, with the exterior of the cabinet shown in phantom, FIG. 2 is a front elevation of a section of the invention along the plane defined by section lines A—A—A, FIG. 3 shows a side view of the interior of one section of the cabinet restricted to the circuit board retainers and backplane, FIG. 4 is a perspective view of a preferred form of circuit board retainer.

Turning first to FIGS. 1 and 2, an outer housing or shell 1 is shown in phantom. The housing is formed of an inner cabinet section 2 and two end sections 3. The only difference between the two end sections as shown in the Figure is that one has been turned 180° about a mutual center axis and has also been turned 180° about a vertical axis. Therefore what would be the bottom of one end section appears at the top, facing the top of the other end section. The parting line between sections is shown as reference numeral 4.

The portions of the end sections which are shown are formed of top and bottom surfaces and an end panel, thus generally forming a pair of facing "U" shapes. Both of the sides are preferably left open to accommodate the insertion of apparatus to be retained from either the front or rear. Of course the completed cabinet can be closed by a door to seal it from view or tampering.

The inner section is generally in the shape of an elongated "I" beam, with a central separator wall 5, across the top and bottom of which are cabinet top and bottom panels which extend to the parting lines 4, and are coextensive with the top and bottom panels of the end sections 3.

Means is provided for connecting the inner section and end sections together, with proper alignment. These preferably take the form of rectangular tubes 6 and 6A. These tubes extend across the tops and bottoms of the inner section and end sections orthogonal to the parting line 4.

Tubes 6A are dimensioned such that they fit within tubes 6. Consequently tubes 6A should extend past the ends of the tops and bottoms of the inner and end sections, whereby when they are fitted within tubes 6, the inner and end sections come together forming parting lines 4. Indeed element 6A need not be actually formed in a tube shape, but can be an extension of the walls of the sections to fit within tube 6, allowing the outside surfaces of the resulting cabinet to be coextended. Indeed, the extension 7 of tube 6A should be dropped slightly from its immediate adjacent surface to accommodate the wall thickness of tube 6.

Clearly other alignment means could be used to fit the sections together. However it is preferred that whatever means are used, the end sections should be identical such that the fewest number of parts would be necessary.

In respect of the preferred embodiment described above, it should be noted that each of the end sections contains a tube 6 along the top or bottom thereof, and a tube 6A along the opposite top or bottom. Inner section 2 has a tube 6 extending along a top or bottom on one side, and a tube 6A extending along the same top or bottom on the opposite side. On the opposite end, on the same side as tube 6, a tube 6A is provided, and on the same side as tube 6A, a tube 6 is provided.

In assembling the cabinet, end sections 3 merely have their tubes 6 and 6A aligned with tubes 6A and 6 respectively of the inner section. The end sections are compressed towards each other, closing the cabinet as a clam shell. Both open sides (front and rear) can be identical.

It is preferred that the cabinet sections should be formed of a plastic material, such as STYRON, or other protective material. Thus a glue can be used to permanently secure the cabinet sections together.

Since the inner and end sections are preferably plastic molded, it may be seen that this assembly forms a very inexpensive cabinet. This form of cabinet would, for use in the prior art, not be satisfactory, however, since it typically has substantial flexibility and relatively poor dimensional tolerance. However the unique interior structure to be described below eliminates what would otherwise be its deficiencies with respect to interior equipment aligment tolerances.

It should be noted that the cabinet can be expanded in a modular manner simply by replacing one of the end sections by one or a sequence of inner sections, the last inner section being completed by fitting an end section to its open region. Therefore the inner sections can be cascaded with identical units, in which the rectangular tubes 6A are fitted into rectangular tubes 6.

The result is a modular cabinet which can define two inner portions separated by wall 5 and the end walls of the end sections (and of course the associated tops and bottoms), or a plurality of inner regions bounded by walls 5, with end interior regions bounded by walls 5 and the end walls of the end sections.

An inexpensive, modular, expandable cabinet thus results, which has only two kinds of parts, inner and end sections.

A plurality of pairs of spaced guides 8 extend inwardly orthogonal to the sides of the end sections and wall 5. Preferable the guides 8 are in the form of lips or lands which are centrally located along vertical axis and extend horizontally outwardly from the associated walls. The lip dimensions should be such that printed circuit board retainers reference 9 can be slid between them, yet they should not interfere with printed circuit boards retained by the retainers.

In order to increase the structural rigidity of the sections, it is preferred that a rigid beam 10 should extend from top to bottom along the end sections and along the walls 5. Indeed, the beams 10 and tubes 6 and 6A can be coextensive, each forming a wall rigidizing support. It has been found that the guides 8 usefully can be extended around beams 10, whereby the printed circuit board retainers are held between guides 8, and between beams 10.

In the embodiment shown, only one pair of guides 8 support a single printed circuit board retainer on each side. However it will be clear to a person understanding this invention that more than one set of guides can be used to horizontally support the printed circuit board retainers.

The positions of guides 8 define the parallel separation of printed circuit board retainers 9. As shown in FIG. 2, but not shown in FIG. 1, the printed circuit retainers 9 contain slots 11 from front to rear (or close to their rear). Printed circuit boards 12, again shown only in FIG. 2, are slid from the front of the retainers 9 along the slots toward the rear of the retainers. Since the retainers 9 have slots 11 in both top and bottom surfaces, the printed circuit boards are retained therebetween once they have been inserted.

FIG. 4 is a perspective view of the preferred form of a printed circuit board retainer 9. The slots 11 which are shown, preferably are located both in the top and bottom surfaces of the retainer, which is shown here in the form of a base. However it is clear that the retainer can be in the form of a stiff frame, with slots or other structures which could hold the printed circuit boards in position.

The inserted ends of the printed circuit board retainers are each fastened to a backplane 13. Thus all of the retainers in each of the housing regions is fixed to a backplane associated with that region. Typically the backplane is formed of a large printed circuit board, on which are disposed conductors as required.

FIG. 3 should now be referred to in conjunction with FIG. 1 and 2. FIG. 3 shows the printed circuit board retainers 9 in spaced relationship as determined by the guides 8 (not shown in this Figure). However the rear ends are maintained in precisely spaced relationship by being fastened to backplane 13. The positioning can be provided by holes 14 in the backplane, the positions of which can be very precisely controlled, and which substantially do not change with external stress on the cabinet outer housing 1.

Preferably the rear end of the retainers 9 are formed into standoffs 15, which locate the distance that the adjacent side of backplane 13 maintains from the rear of retainers 19. Also preferably the standoffs have cylindrical threaded extensions 16 which pass through holes 14. With retainers 9 positioned with their extension 16 through holes 14 of backplane 13, their rear ends are precisely located with respect to the backplane 13. Screws 17 can be screwed into the threaded extension 16, fastening the printed circuit board retainers in place.

Printed circuit board connectors 18 are fixed to backplane 13 on its side between retainers 9, in a well known manner, and its terminals soldered to the backplane 13 also in a well known manner.

Thus when printed circuit boards 12 are slid via slots 11 toward the backplane, their end connector terminals can be inserted into connectors 18, since they have been precisely located due to the precision of the location of the rear end of retainers 9 with respect to the backplane 13, and thus to the connectors 18.

As may be seen in FIG. 4, the front of retainer 9 is formed into a lip 19 which extends across the front of each retainer. The lip 19 contains slots 20, each of which extends in front of slot 11. This provides leverage points for printed circuit board extractors or locks 21, which facilitates firm insertion and extraction of the printed circuit boards from connectors 18, in a well known manner.

As noted earlier, it is preferred that printed circuit board retainers 9 should contain elongated slots 11 from front to rear, on both sides thereof as shown in FIGS. 2 and 3.

It will be noted that if backplanes 13 were merely fixed to printed circuit board retainers 9 which are held within guides 8, the entire assembly would be moveable front and rearwardly. This of course would not be desirable.

According to the preferred embodiment of the present invention, the top edges of retainers 9 contain cut-outs 22 which extend along the edges from the rear end toward the front. The ends 23 of the cut-outs 22 bear against the guides 8, providing a stop in one direction.

Backplane stops 24 extend inwardly from the walls of the cabinet 5, provide surfaces against which the backplane bears. Consequently when the retainers 9 are fastened to backplanes 13, they are securely held between cut-out ends 23 and backplane stops 24. They can also serve as printed circuit board retainer supports.

Of course other means for providing stops can be used, such as L brackets attached to the side edges of the printed circuit board retainers which would bear against guides 8, and L brackets extending inwardly of the walls of the cabinet to provide stops for the backplanes 13.

It should be noted that cut-outs 22 also provide means for physically polarizing the printed circuit board retainers 9, in order that they could only be inserted in one direction if desired. In FIG. 2 it will be noted that one of each of the guides of each pair is shown longer than the other. The short guide fits into cut-out 22, while the long guide extends over the retainer a distance farther than the width of cut-out 22. The distance between each guide in the pair is the distance between the inner surface of the cut-out 22 and the opposite surface of retainer 9. As a result if retainer 9 is attempted to be inserted up-side-down, it is prohibited by the longer guide not fitting into cut-out 22. Polarization of the orientation of the printed circuit board retainers sometimes would be desirable, for example, in the event the printed circuit board extractors or locks require slots 22 or other mechanisms which are not identical on the top or bottom of the retainers. Thus in some structures it may be desirable to predetermine the direction that the printed circuit board retainers face.

It is thus clear that the only support for the backplane is the printed circuit board retainers and stops; the backplanes are not structurally fixed to the cabinet by other means. The printed circuit board retainers to which the backplanes are fixed with precision, are themselves only approximately positioned by the cabinet. Therefore relatively poor tolerance manufacture of the cabinet will not affect the position of the printed circuit boards relative to the backplane connectors, as had been common in the prior art.

It should be noted that there are various sets of guide pairs utilized along a vertical axis, in order to facilitate the use of a plurality of printed circuit board guides. These can of course be spaced as desired, and, indeed, redundant pairs of guides could be used to facilitate the use of various sizes of printed circuit boards, as defined by the distance between the printed circuit board retainers. The cabinet can thus be made as an universal cabinet which could accommodate different sizes of boards according to the application, without the necessity for producing new cabinets for different applications.

It is preferred that the guides 8, tubes 6 and 6A and the walls of a section should be molded in one piece. Alternatively, if desired the guides 8 can be formed as separate clamping or fastened items, which are preferably fastened to beams 10.

The present invention has proved to provide a substantially reduced cost cabinet, of modular and easy to assemble construction, which provides improved ease of assembly and ease of ensuring precision of location of the parts which are required to be precisely located. At the same time the precision can be maintained even in the presence of external stresses placed on the cabinet housing itself.

A person understanding this invention may now conceive of alternative embodiments using the principles described herein. All are considered to be within the sphere of the invention as defined in claims appended hereto.

I claim:

1. An equipment cabinet comprising:
   (a) one or more identical first cabinet sections, each of said first cabinet sections including first and second open portions and a wall for separating said open portions, means for connecting the first and second open portions of respective ones of said cabinet sections to each other thereby forming one or more enclosed regions having said first and second open portions disposed at opposite ends thereof,
   (b) a pair of additional cabinet sections, each of said additional cabinet sections including a further open portion bounded by a further wall,
   (c) means for connecting the further open portions of said additional cabinet sections to the first and second open portions disposed at said opposite ends of said enclosed regions, thereby forming a shell comprised of said one or more first cabinet sections bounded at opposite ends by said additional cabinet sections,
   (d) pairs of spaced guides fixed on each wall of said first cabinet sections, and each further wall of the additional cabinet sections, the guides being in alignment with each other,
   (e) a first circuit board retainer retained between the guides,
   (f) a circuit backplane for receiving and retaining circuit boards in conjunction with said retainer,
   (g) means for fixing said backplane in a predetermined orientation relative to said retainer, and remotely of said first and additional cabinet sections,
   wherby a plurality of said retainers can be held in approximate predefined positions in each divided portion of the shell, and alignment of said retainer and backplane is independent of the structure of said cabinet, and whereby a cabinet having multiple enclosed regions is formed with a plurality of pairs of spaced guides on opposite sides of each enclosed region.

2. A cabinet as defined in claim 1, in which the connecting means is comprised of alignment tubes fixed to one of the inner cabinet sections and end sections for fitting into a corresponding tube slightly larger or smaller in size fixed to an adjacent one of the inner cabinet section and end section, and means for locking the sections together.

3. A cabinet as defined in claim 1, including stop means for fixing the lateral positions of the retainers and backplane, and a plurality of circuit board connectors fixed to the backplane between the retainers.

4. A cabinet as defined in claim 1, including a slot extending partway along at least one side of the retainers for accommodating at least one of the guides, whereby a stop is formed to inhibit extention of the retainers into the cabinet more than a predetermined distance.

5. A cabinet as defined in claim 1, in which the sections are formed of a molded plastic material.

6. A cabinet as defined in claim 2, including stop means for fixing the lateral positions of the retainers and backplane, and a plurality of circuit board connectors fixed to the backplane between the retainers.

7. A cabinet as defined in claim 2, including a slot extending partway along at least one side of the retainers for accommodating at least one of the guides, whereby a stop is formed to inhibit extention of the retainers into the cabinet more than a predetermined distance.

* * * * *